(12) United States Patent
Schivalocchi

(10) Patent No.: US 12,257,801 B2
(45) Date of Patent: Mar. 25, 2025

(54) PRESSING GROUP FOR A SINTERING PRESS FOR SINTERING ELECTRONIC COMPONENTS ON A SUBSTRATE

(71) Applicant: AMX—AUTOMATRIX S.R.L., Gavardo (IT)

(72) Inventor: Nicola Schivalocchi, Gavardo (IT)

(73) Assignee: AMX—AUTOMATRIX S.R.L, Gavardo (IT)

( * ) Notice: Subject to any disclaimer, the term of this patent is extended or adjusted under 35 U.S.C. 154(b) by 870 days.

(21) Appl. No.: 17/256,119

(22) PCT Filed: Jun. 19, 2019

(86) PCT No.: PCT/IB2019/055170
§ 371 (c)(1),
(2) Date: Dec. 24, 2020

(87) PCT Pub. No.: WO2020/008287
PCT Pub. Date: Jan. 9, 2020

(65) Prior Publication Data
US 2021/0170708 A1     Jun. 10, 2021

(30) Foreign Application Priority Data

Jul. 2, 2018   (IT) .................... 102018000006846

(51) Int. Cl.
*B30B 11/02*   (2006.01)
*B22F 3/10*    (2006.01)
(Continued)

(52) U.S. Cl.
CPC ............. *B30B 11/027* (2013.01); *B22F 3/10* (2013.01); *B30B 15/34* (2013.01); *H01L 21/50* (2013.01);
(Continued)

(58) Field of Classification Search
CPC ...... B22F 3/02; B22F 3/03; B22F 3/10; B30B 11/027; B30B 15/34; H01L 2021/6015;
(Continued)

(56) References Cited

U.S. PATENT DOCUMENTS

| 7,270,258 B2 * | 9/2007 | Maki .................. H01L 23/3128 |
| | | 228/234.1 |
| 2015/0075301 A1 * | 3/2015 | Scialo ................ G01N 15/0612 |
| | | 73/863.22 |
| 2017/0229418 A1 * | 8/2017 | Osterwald ............... H01L 24/75 |

FOREIGN PATENT DOCUMENTS

| DE | 102008048869 A1 | 4/2010 |
| JP | 2002110744 A | 4/2002 |

(Continued)

OTHER PUBLICATIONS

International Search Report, issued in PCT/IB2019/055170, mailed Sep. 27, 2019, Rijswijk, Netherlands.

*Primary Examiner* — Philip C Tucker
*Assistant Examiner* — Jimmy R Smith, Jr.
(74) *Attorney, Agent, or Firm* — ArentFox Schiff LLP; Michael Fainberg

(57) ABSTRACT

A pressing group for a sintering press to carry out sintering of electronic components on a substrate has a multi-stem cylinder having a front head and a rear head together delimiting a compression chamber. In the front head pressing stems are slidingly supported, parallel and independent from each other, the rear ends of the pressing stems protruding into the compression chamber. In the compression chamber, an actuating flat gasket extends over the rear ends of the pressing stems. The actuating flat gasket is fixed to the front head by an anchoring frame engaging a peripheral portion of the actuating flat gasket, the anchoring frame
(Continued)

being completely housed in the compression chamber so that the pressurized fluid also acts on the anchoring frame.

12 Claims, 10 Drawing Sheets

(51) Int. Cl.
    *B30B 15/34*     (2006.01)
    *H01L 21/50*     (2006.01)
    *H01L 21/60*     (2006.01)
    *H01L 21/67*     (2006.01)
    *H01L 23/00*     (2006.01)

(52) U.S. Cl.
    CPC ........ *H01L 21/67103* (2013.01); *H01L 24/83* (2013.01); *H01L 2021/6015* (2013.01); *H01L 2224/83203* (2013.01); *H01L 2224/8384* (2013.01)

(58) Field of Classification Search
    CPC ............... H01L 21/50; H01L 21/67103; H01L 2224/75101; H01L 2224/7525; H01L 2224/753; H01L 2224/75901; H01L 2224/83203; H01L 2224/8384; H01L 24/75; H01L 24/83
    See application file for complete search history.

(56) References Cited

FOREIGN PATENT DOCUMENTS

| | | |
|---|---|---|
| JP | 2005093838 A | 4/2005 |
| JP | 2016507164 A | 3/2016 |
| WO | 2018122795 A1 | 7/2018 |

\* cited by examiner

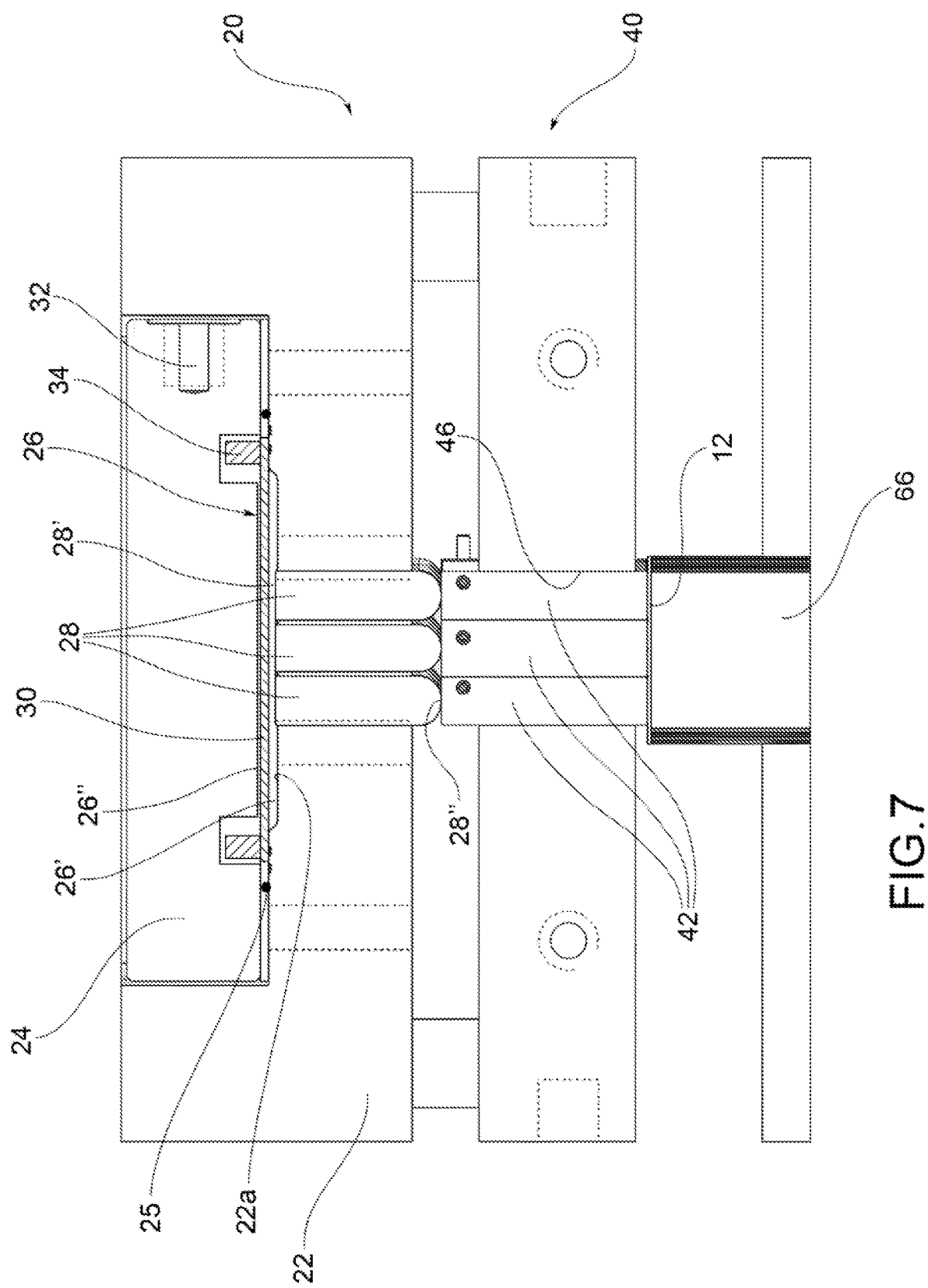

PRESSING GROUP FOR A SINTERING PRESS FOR SINTERING ELECTRONIC COMPONENTS ON A SUBSTRATE

CROSS-REFERENCE TO RELATED APPLICATIONS

This application is a National Phase Application of PCT International Application No. PCT/IB2019/055170, having an International Filing Date of Jun. 19, 2019 which claims priority to Italian Application No. 102018000006846 filed Jul. 2, 2018, each of which is hereby incorporated by reference in its entirety.

FIELD OF THE INVENTION

The present invention relates to sintering presses of electronic components on a substrate, and in particular it relates to a pressing group for such presses.

BACKGROUND OF THE INVENTION

As is known, in some electronic applications, integrated electronic components, such as diodes, IGBTs, thermistors, MOSFETs, are fixed to a substrate by the interposition of a layer of sintering glue.

In order for each component to be sintered correctly, it must be pressed with a force proportional to its projection surface and subjected to a predetermined temperature for a predetermined period of time. Since the electronic components to be fixed on a substrate can have dimensions, that is, the projection surfaces of the relative casings and thicknesses, even considerably different from each other, the application of a pressure on a single pressing member acting on all the components of a substrate does not allow the desired strength to be imparted on all components.

Furthermore, it is necessary to consider the further complications due to the fact that the glue layer may have a thickness that is not perfectly identical and homogeneous for all the components.

In a patent application no. PCT/IB2017/058520, on behalf of the same Applicant and currently still secret, a sintering press has been proposed for sintering electronic components on a support, able to overcome the drawbacks and limitations of the devices according to the prior art. Such a press is provided, in particular, with a pressing group comprising a multi-stem cylinder having a front head and a rear head which jointly delimit a compression chamber.

In the front head, pressing stems parallel and independent of each other are slidingly supported. Each pressing stem is coaxial to a respective electronic component to be sintered and has a thrust section proportional to the force to be applied to the respective electronic component, the area of each electronic component to be sintered and for a predetermined sintering pressure being known.

In the compression chamber, a sealing membrane extends which hermetically divides the compression chamber into a rear chamber and a front chamber. The rear chamber is in fluidic communication with an inlet passage of a fluid under pressure to achieve the sintering pressure. The rear ends of the pressing stems protrude in the front chamber. The sealing membrane is placed in contact with the rear ends of the pressing stems so that when the rear chamber is pressurized to the sintering pressure, the sealing membrane is deformed by abutting against the rear ends for a transfer of the sintering pressure on each pressing stem.

Such a press therefore allows exerting a thrust force on each electronic component to be sintered proportional to the surface thereof, due to the use of a pressing stem for each component, the section of said pressing stem being chosen according to the surface to be pressed.

The sealing membrane, which is in practice formed by a flat gasket, performs both a sealing function for all the pressing stems and a piston function which acts on all the pressing stems, deforming itself so as to adapt to their dimensions.

The sealing membrane is held peripherally between the front and rear heads of the multi-stem cylinder. Therefore, the flat gasket deforms when subjected to the action of the fluid under pressure, but does not translate axially with respect to the compression chamber.

However, it has been found that, over time, due to the high pressure to which it is subjected in the non-retained central zone between the two heads of the multi-stem cylinder, which can even reach hundreds of bars, the flat gasket tends to lose its original elasticity or even to become ruined and tear. After a certain number of pressing cycles, the flat gasket must therefore be replaced.

SUMMARY OF THE INVENTION

The object of the present invention is to propose a pressing group of the type described above, which is able, however, to overcome the drawbacks described above in relation to the flat gasket.

Said object is achieved by a pressing group and a sintering method as described and claimed herein.

BRIEF DESCRIPTION OF THE DRAWINGS

The features and the advantages of the pressing group according to the invention shall be made readily apparent from the following description of preferred embodiments thereof, provided purely by way of a non-limiting example, with reference to the accompanying figures, in which:

FIG. 7 is an enlarged schematic view of part of the pressing group and of the substrate support unit, showing in particular the non-pressurized compression chamber and some pressing stems and heating pressing members in contact with respective electronic components of a substrate;

DETAILED DESCRIPTION

Figure 1:
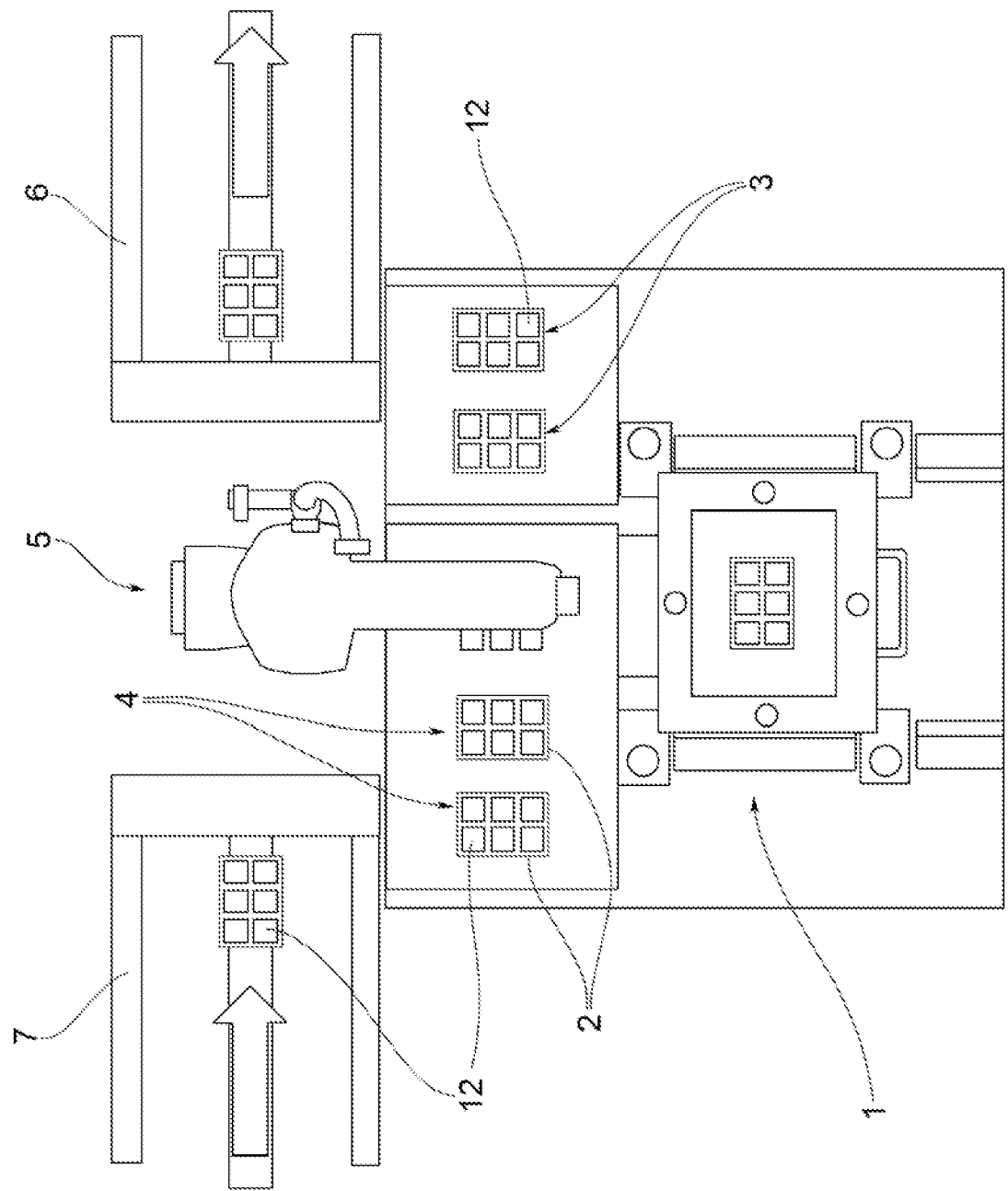
FIG. 1 is a schematic plan view of a sintering island which uses a sintering press.

With reference to the accompanying drawings, a sintering island will be described hereinafter using a press 1 having a pressing group according to the invention to perform the sintering of electronic components 10 on a substrate 12.

The substrate 12 arrives at the sintering press 1 contained in a pallet 2, for example adapted to contain six substrates 12.

The substrates 12 are positioned in respective seats formed in the pallet 2 and adapted to support the substrates 12 on suitable projections.

The substrates 12 carry the electronic components 10 to be sintered (for example, IGBTs, diodes, thermistors, MOSFETs) positioned on a layer of sintering glue. The components 10 must be processed with a predefined surface pressure, for example of 30 MPa, at a predefined temperature, for example of 260° C., for 180÷300 seconds.

The pallets 2 with the non-sintered substrates 12 must be handled smoothly without shocks at moderate speeds, in order not to modify the positions of the electronic components 10.

The electronic components 10 must be pressed with a force directly proportional to their projection surface, taking into account that the components have a thickness diversified by family.

Furthermore, any non-parallelism of the substrate-glue-electronic component assembly, for example of 1 µm over 10 mm, must be compensated.

As illustrated in FIG. 1, in one embodiment, the sintering island comprises at least one, preferably two preheating stations 3 of the pallets 2 to 150° C., and at least one, preferably three cooling stations 4 of the pallets 2 to 50° C.

In one embodiment, the sintering island comprises an anthropomorphic robot 5, for example of the 6-axis type, of 10 kg, provided with a six-jaw self-centering gripper.

The robot 5 manipulates the pallets 2 between:
an inlet conveyor 6 and reader of the two pre-heating stations 3;
the two pre-heating stations 3 and the sintering press 1;
the sintering press 1 and the three cooling stations 4;
the three cooling stations 4 and an outlet conveyor 7.

The two pre-heating stations 3 provide to raise the temperature of the respective substrates 12 to a temperature of 150° C.

For example, the two pre-heating stations 3 are heated by armored electric cartridges controlled by PID and PWM thermoresistances PT100.

Figure 2:
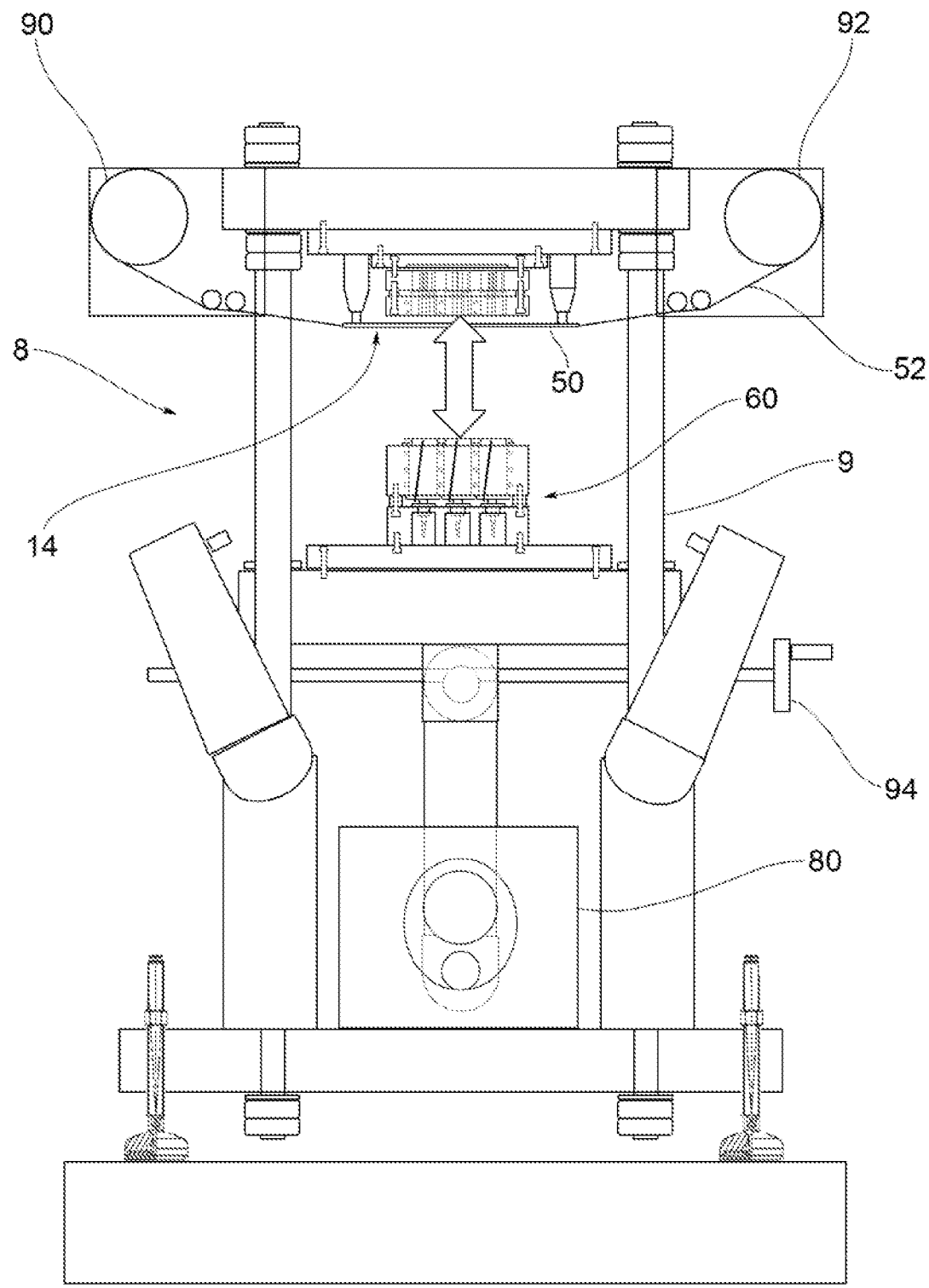
FIG. 2 is an elevation view of the press.

The sintering press 1, illustrated globally in FIG. 2, comprises a vertically extending frame 8 which supports a pressing group 14 at the top and a support unit 60 at the bottom for at least one substrate 12, preferably six in the example shown.

The frame 8 is provided with longitudinal guides 9 along which the support unit 60 slides, operated by a hydraulic or electric actuator 80.

In one embodiment, the support unit 60 performs a stroke of 200 mm, with uniformly accelerated and decelerated motion.

In particular, the upper position of the support unit 60 is absolutely irreversible and is sized to counteract forces up to 250 KN without moving.

In one embodiment, the stroke of 200 mm is implemented in 3 seconds, with a 1 Kw brushless geared motor 80, and can be implemented in jog at reduced speed for mold changing and maintenance functions.

In one embodiment, the frame 8 also supports a motorized winder 90 and an unwinder 92, for example with brushless gear motors, for the replacement of a protective film 52, for example PTFE, to be interposed between the substrates 12 and the pressing group 14 during sintering.

In one embodiment, the protective film 52 is supported by a peripheral frame 50. This peripheral frame 50, in one embodiment, also supports suction/blowing means directed towards the protective film 52.

Furthermore, the press 1 is provided with a vacuum pump—not shown—for sucking the air between the PTFE film and the pressing group 14.

In one embodiment, the press 1 is also provided with a blow ionizing device—not shown—to remove any electrostatic charges in the sintering area.

In one embodiment, the frame 8 also supports horizontal sliding guides that can be inserted and removed with a right-hand and a left-hand handgrip 94, to facilitate the replacement of the support unit 60.

Figure 3:
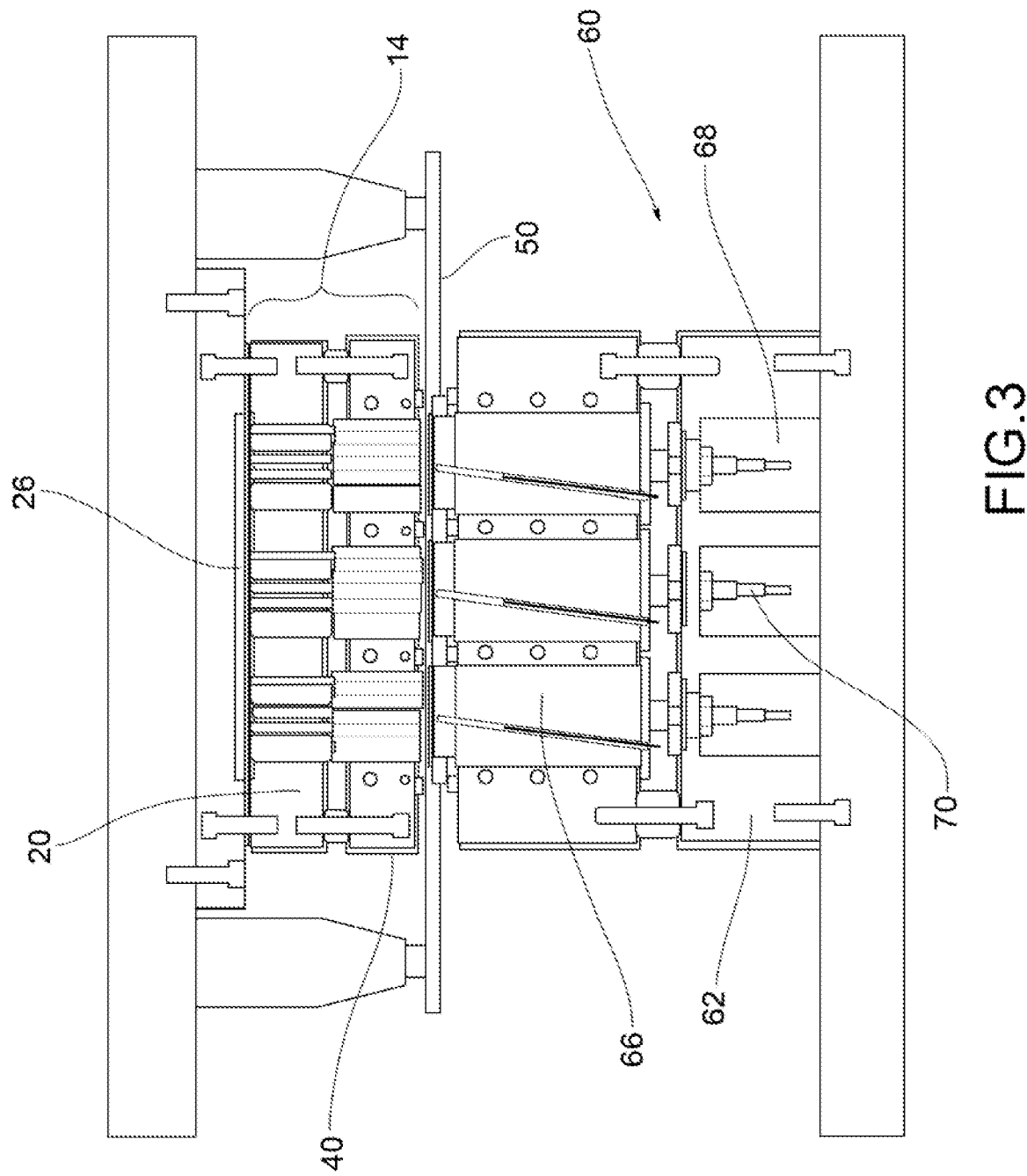
FIG. 3 is an axial section view of the pressing group of the press closed on a substrate support unit.
Figure 4:
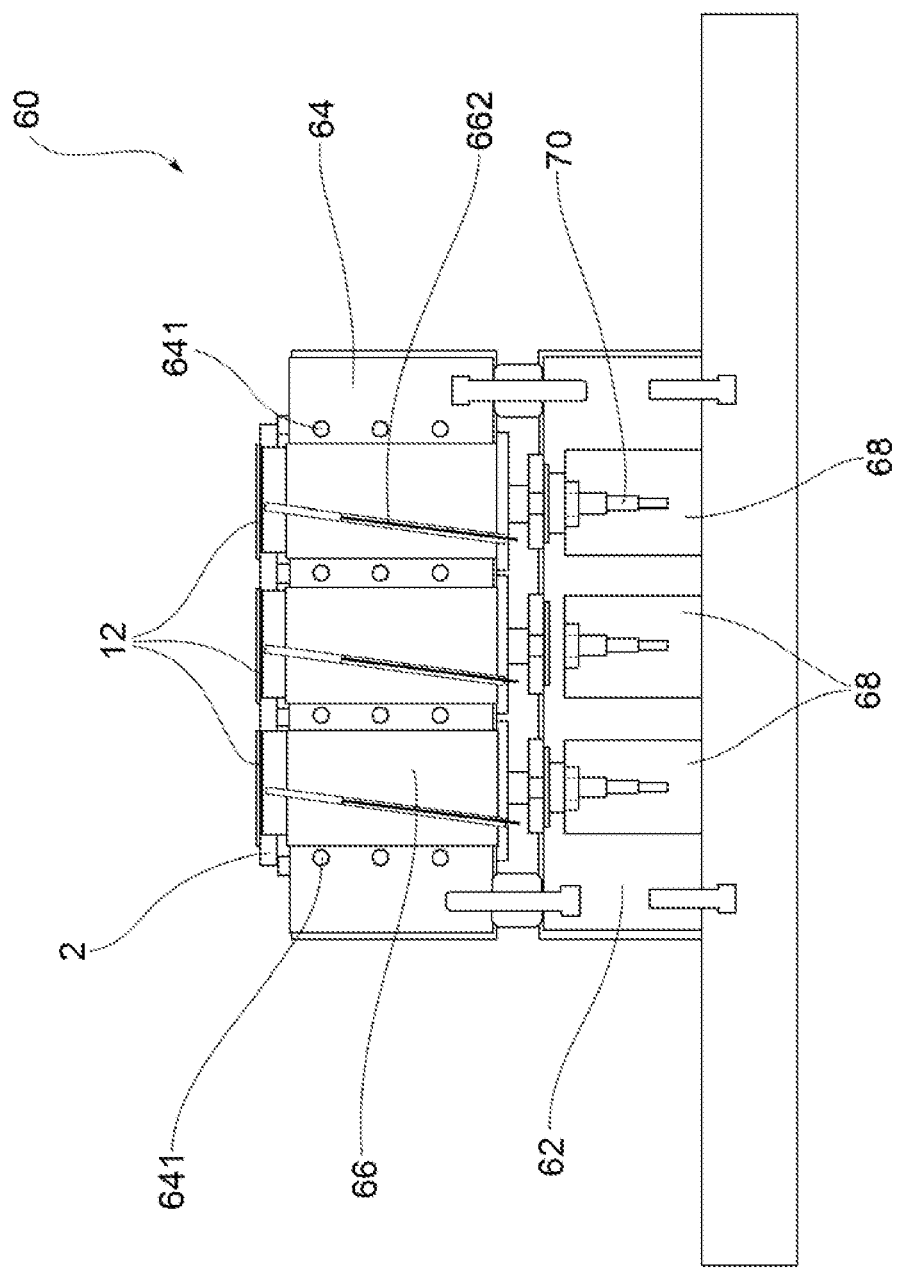
FIG. 4 is an axial section view of only the substrate support unit of the press.
Figure 5:
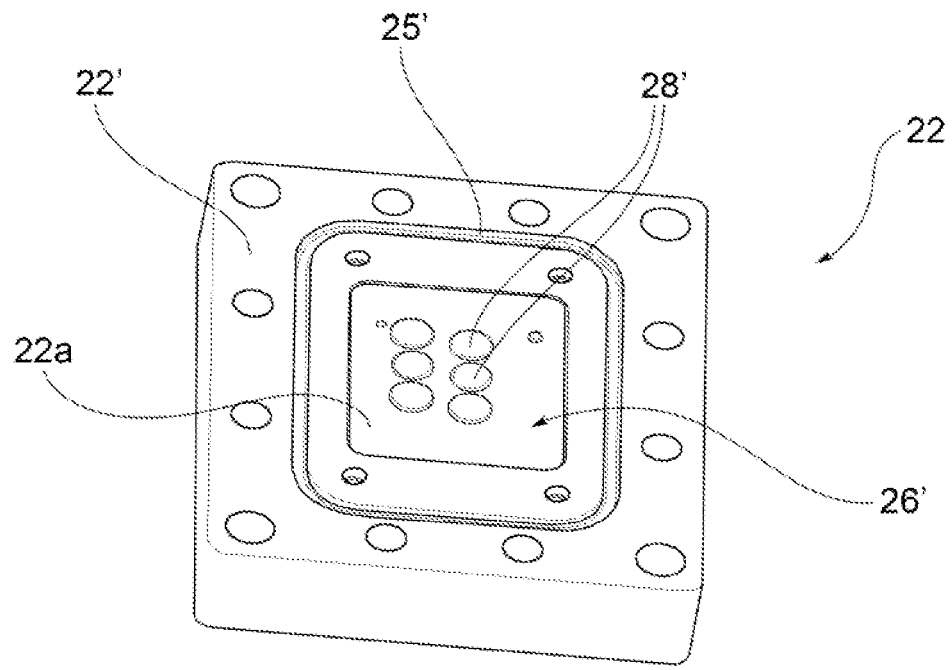
FIG. 5 is a top perspective view of the front head of the multi-stem cylinder of the pressing group, without the flat actuating gasket and the relative frame for anchoring it to the front head.
Figure 5A:
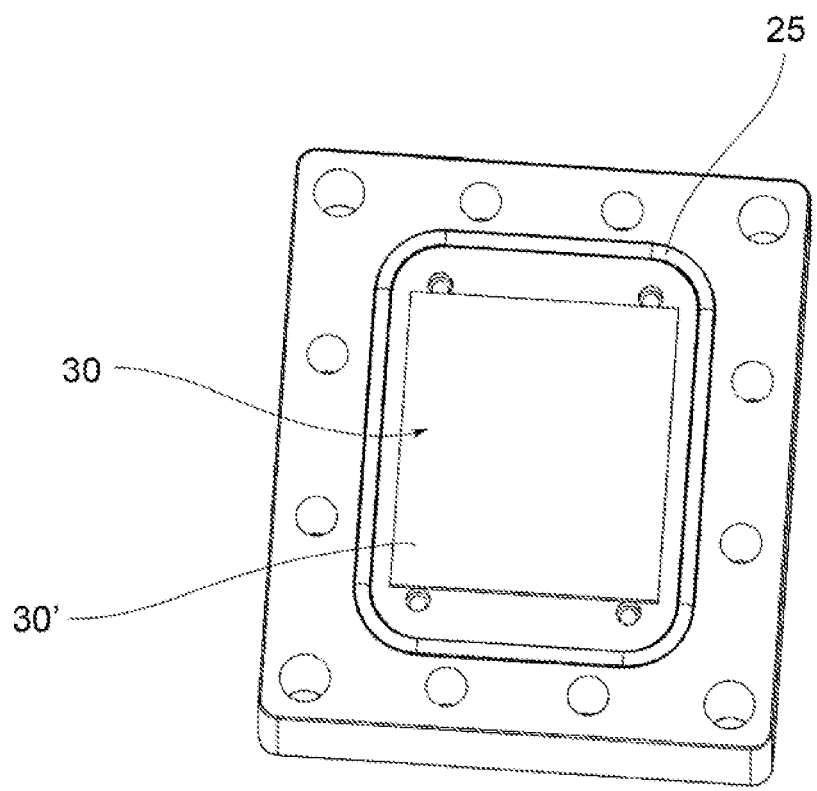
FIG. 5a is a view similar to the preceding one, with the actuating flat gasket positioned on the front head.
Figure 5B:
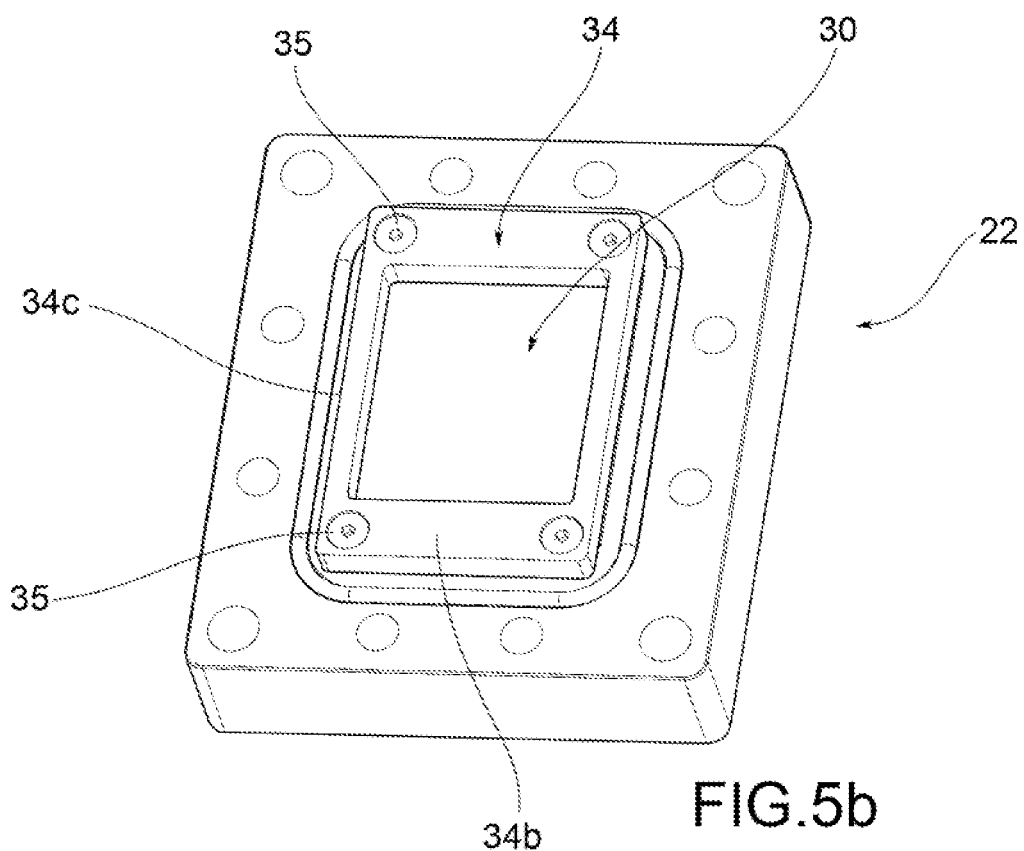
FIG. 5b is a perspective view similar to the previous one, with the anchoring frame which blocks the actuating flat gasket to the head.
Figure 5C:
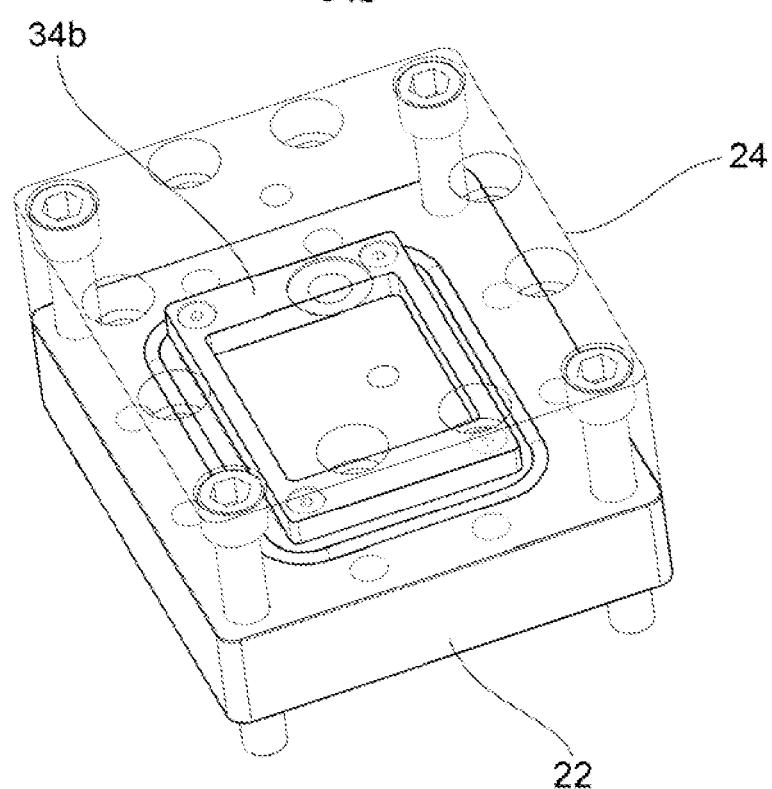
FIG. 5c is a perspective view of the assembled multi-stem cylinder, with the rear head shown in transparency.

In an embodiment, shown in particular in FIGS. 3 and 4, the support unit 60 comprises a fixed reaction block 62, wherein six deformation cylinders 68 are accommodated, provided with respective deformation sensors 70 able to operate at 350° C.

The support unit 60 further comprises a heating block 64 in which armored heating resistances 641 are accommodated.

The support unit further comprises six movable reaction blocks 66, each provided with a respective temperature sensor 662.

The pressing group 14 comprises a multi-stem cylinder 20 having a front head 22 and a rear head 24 which jointly delimit a compression chamber 26.

Between the front head 22 and the rear head 24 there is interposed an annular sealing element 25 positioned around the compression chamber 26.

For example, the annular sealing element 25 is placed in a respective seat 25' formed between a flat portion of the rear end surface 22' of the front head 22 and a flat portion of the front end surface 24' of the rear head 24, such flat portions being facing and parallel to each other.

The annular sealing element 25 therefore performs the function of preventing the escape, between the two side-by-side heads 22, 24 of a fluid under pressure present in the compression chamber 26.

For example, the annular sealing element 25 consists of an O-ring.

In the rear head 24 an inlet passage 32 is made for introducing a pressurized fluid into the compression chamber 26.

In the front head 22, pressing stems 28 parallel and independent of each other are slidingly supported. The rear ends 28' of such pressing stems 28 protrude in the compression chamber 26.

In the compression chamber 26, an actuating flat gasket 30 extends over the rear ends 28' of the pressing stems 28 in such a way that, when the compression chamber 26 is pressurized, the actuating flat gasket 30 acts on such rear ends 28' to transfer pressure in the compression chamber on each individual pressing stem 28.

For example, each rear end 28' of the pressing stems 28 ends with a flat surface on which the flat gasket 30 is pressed.

According to an aspect of the invention, the actuating flat gasket 30 is fixed to the front head 22 by means of an anchoring frame 34 which engages a peripheral portion 30' of the actuating flat gasket 30.

In other words, a peripheral portion 30' of the flat gasket 30 is at least partially inserted between the front head 22 and a base or front surface 34a of the anchoring frame 34.

The anchoring frame 34 is housed completely in the compression chamber 26 so that the pressurized fluid that is introduced into the compression chamber 26 acts, as well as on the flat gasket 30, also on the anchoring frame 34.

As mentioned, the flat gasket 30, held in position by the anchoring frame 34, performs the double function of sealing gasket and actuating membrane on the pressing stems 28.

In particular, when the compression chamber 26 is pressurized, the pressure of the fluid weighs not only on the central portion of the flat gasket, but also, through the anchoring frame 34, on the peripheral portion 30'. Consequently, the flat gasket 30 is stressed uniformly and at the same time in compression over the entire surface thereof. This avoids undesired deformations of the gasket, considerably increasing the life thereof.

More in detail, the rear head 24 forms a bottom wall 27 for the compression chamber 26; the anchoring frame 34 has a rear surface 34b facing towards and spaced from such a bottom wall 27.

In one embodiment, the compression chamber 26 is radially delimited by a side wall 29; the anchoring frame 34 has a side surface 34c facing towards and separated from said side wall 29.

In this way, the pressurized fluid acts on all the exposed sides of the anchoring frame 34, so as to prevent it from moving or deforming.

In one embodiment, the anchoring frame 34 is screwed to the front head 22 by means of anchoring screws 35.

It should be emphasized, however, that the fixing, for example by means of the anchoring screws 35, of the anchoring frame 34 to the front head 22 does not have the function of retaining the flat gasket 30 when the compression chamber 26 is pressurized, but only to hold it in the correct position when the compression chamber is not pressurized. In fact, in the presence of the pressurized fluid in the compression chamber 26, it is the pressure exerted by the fluid which allows the flat gasket 30 to be locked in position.

In one embodiment, the flat gasket 30 divides the compression chamber 26 into a front portion 26', in which the rear ends 28' of the pressing stems 28 protrude, and a rear portion 26" in fluidic communication with the inlet duct 32.

In one embodiment, the front portion 26' of the compression chamber 26 is formed in a lowered portion 22a of the rear end surface 22' of the front head 22.

In the absence of pressure in the compression chamber 26, the flat gasket 30 is substantially in a flat resting configuration and is positioned so as to slightly touch the rear ends 28' of the pressing stems 28 (FIG. 7).

Figure 7A:
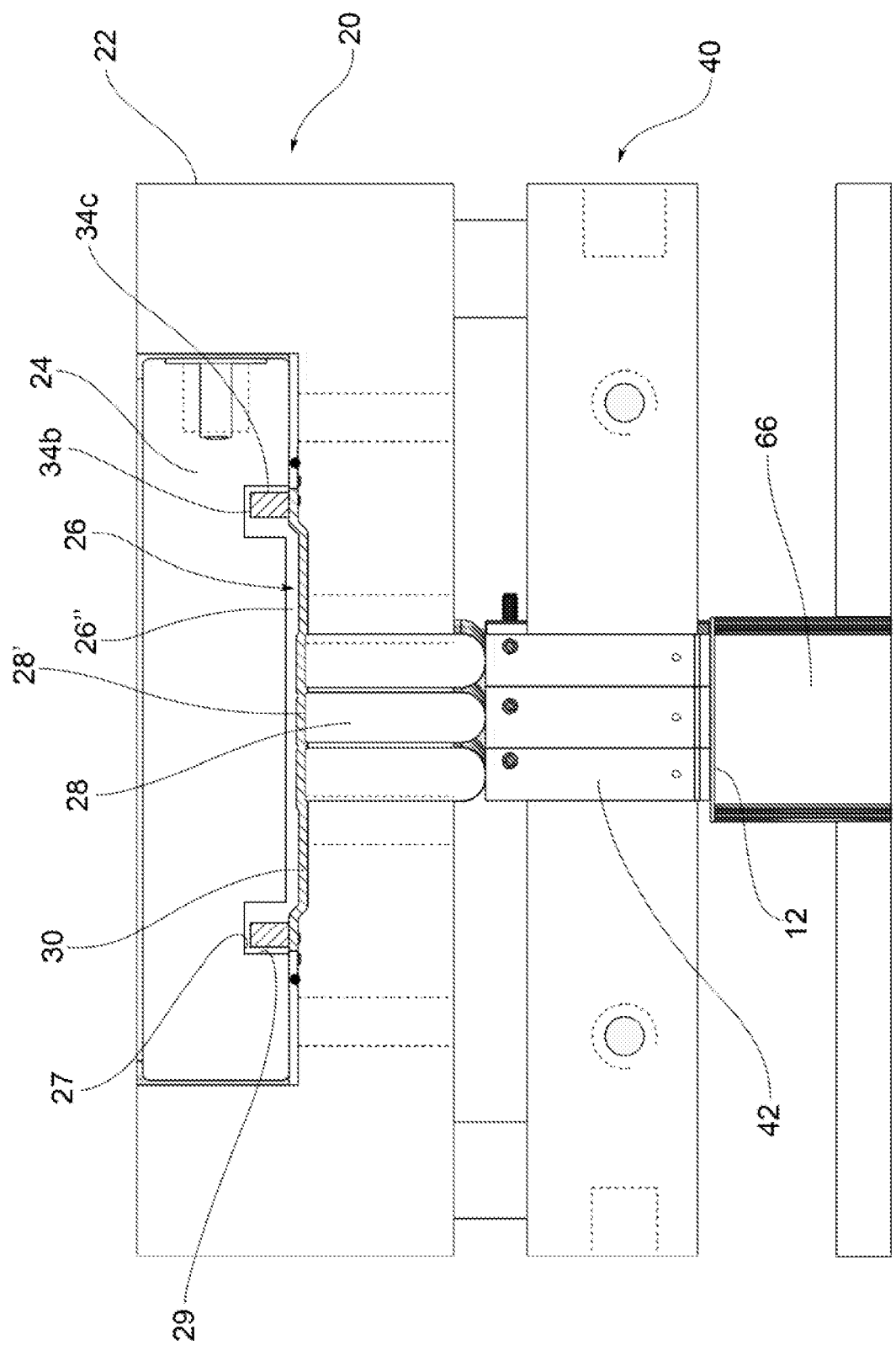
FIG. 7a is a view similar to the preceding one, but with the compression chamber pressurized.

When the rear portion 26" is pressurized at the sintering pressure, the flat gasket 30 is deformed, thereby abutting against the rear ends 28' of the pressing stems 28 for a transfer of the sintering pressure on each pressing stem 28 (FIG. 7a).

Figure 6:
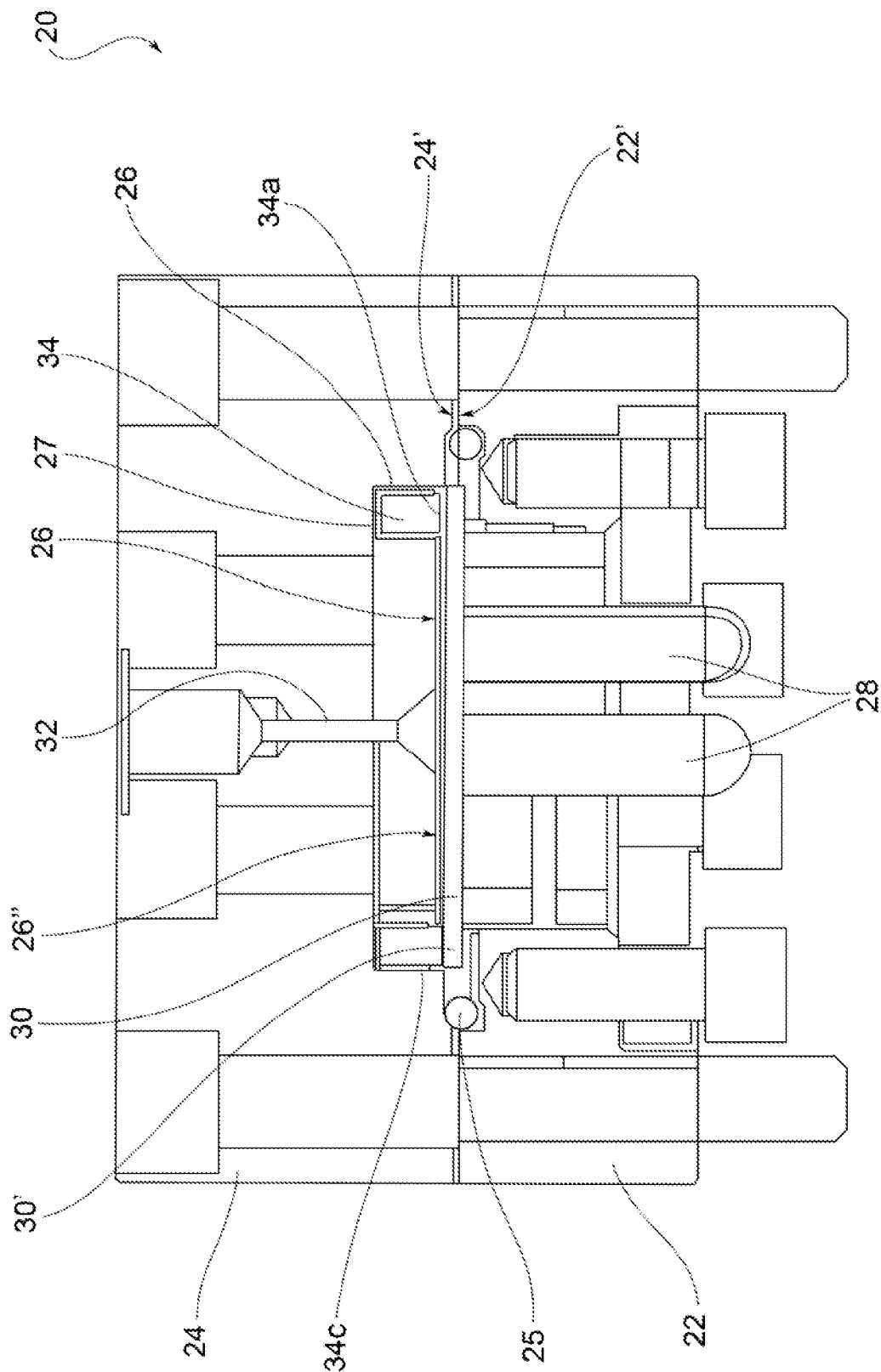
FIG. 6 is an axial section of only the pressing group of the press.

More precisely, the projection of the rear ends 28' of the pressing stems 28 with respect to the lowered portion 22a of the front head 22, and thus the distance between the flat gasket 30 and said lowered portion 22a, are selected such that when the rear portion 26" is pressurized at the sintering pressure and the flat gasket 30 is deformed, the gasket abuts not only against the rear ends 28' of the pressing stems 28, but also against the lowered portion 22a of the front head 22, as shown in particular in FIG. 6a.

Due to this conformation of the compression chamber 26, the flat gasket 30 behaves as if the control fluid acts directly on the individual rear ends 28' of the pressing stems 28 at the desired sintering pressure. In other words, the flat gasket 30 simulates the behavior of a plurality of independent cylinder-piston systems.

Returning now to the pressing stems 28, each of them is coaxial and barycentric to a respective electronic component 10 to be sintered and has a thrust section proportional to the force to be exerted on the respective electronic component 10, the area of each electronic component to be sintered being known and for a predetermined sintering pressure.

The term "barycentric" means that each pressing stem 28 has a stem axis which coincides with the center of gravity of the respective electronic component 10.

In one embodiment, the pressing group 14 further comprises a heating block 40 integral with the multi-stem cylinder 20 and which slidingly supports heating pressing members 42. Each heating pressing member 42 can be actuated by a respective pressing stem 28 to act on a respective electronic component 10 to be sintered.

Figure 8:
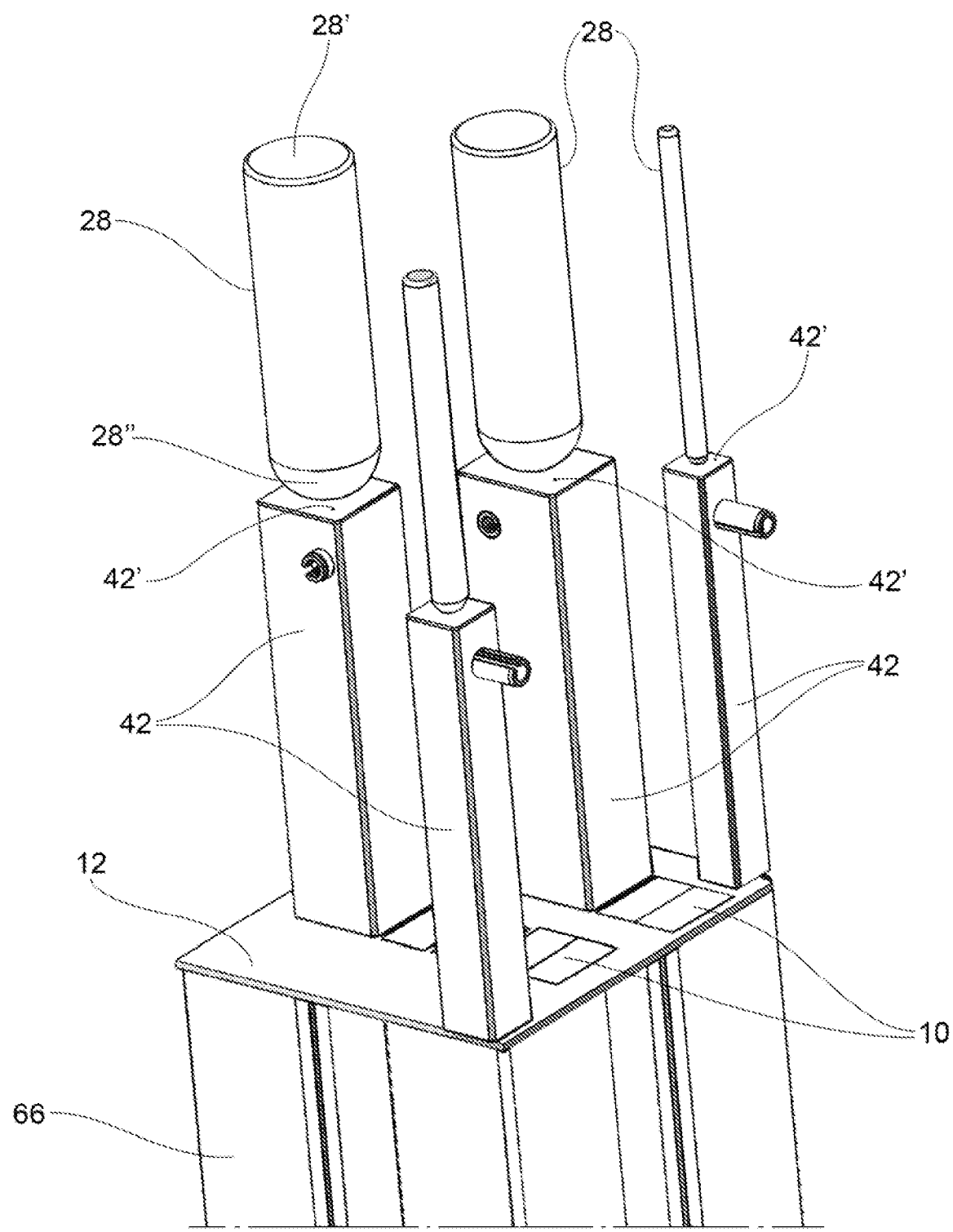
FIG. 8 is schematic a perspective view of some pressing stems and heating pressing members in contact with electronic components of a substrate.

The perspective view in FIG. 8 shows four pressing stems 28, of different sections, which act on respective heating pressing members 42, also of different section.

The heating pressing members 42 are shown in abutment on the respective electronic components 10, resting on a substrate 12 supported by the support unit 60.

In one embodiment, the pressing stems 28 have rounded front ends 28" which are in contact with flat surfaces 42' of the heating pressing members 42. For example, the front ends 28" of the pressing stems 28 are spherically rounded to concentrate the compressive force in the barycentric point of the corresponding electronic component to be sintered and at the same time to make a thermal break between the pressing stems 28 and the pressing members 42. In this way, the heating pressing members 42 can easily adapt to the surface of the electronic components to be pressed and heated.

In one embodiment, the heating pressing members 42 are in the form of bars having a cross section substantially corresponding to or greater than the area of the casing of the respective electronic component 10 to be sintered.

In one embodiment, the multi-stem cylinder 20 is capable of imparting to the single pressing stems 28 a force proportional to the cross-section thereof, to develop a pressure corresponding to 30 MPa on all the electronic components 10.

In one embodiment, for each substrate 12 there are provided four pressing stems and members for IGBTs, pressing stems and members for diodes, a pressing stem and members for a thermistor, a pressing stem and a member for MOSFET, for a total of 48 pressing members and relative pressing stems, all independent and of differentiated section proportional to the thrust to be developed.

In one embodiment, the compression chamber 26 can be pressurized up to 35 MPa (350 bar).

As said, the heating pressing members 42 have the task of transmitting the compression force and the heating to the electronic components 10 to be sintered on the substrate 12.

In one embodiment, the heating block 40 is provided with armored resistances 44 and temperature sensors.

The pressing members 42 are pushed barycentrically with respect to the corresponding electronic component 10 to be sintered on the substrate, and slide into the heating block 40 with a suitable clearance to allow them an adjustment to a parallelism of 1 µm over 10 mm.

It should be noted that if the thicknesses of the electronic components 10 change, they do not cause changes in the sintering pressure of the other components.

It should be noted that, as mentioned above, while the axis of each pressing stem 28 must coincide with the center of gravity of the respective electronic component 10, the shape, the section and the position of the pressing members 42 with respect to the axis of the respective pressing stems 28 can be selected according to the shape of the electronic components 10 and/or the position thereof on the substrate.

For example, the pressing members 28 can be selected in such a way as to sinter in a reliable and precise manner electronic components 10 which are also very close to each other or of a non-rectangular or very different size.

It should also be noted that the implementation of each pressing member of the pressing group 14 in two separate components, the pressing stems 28 and the pressing members 42, placed in contact through a substantially spherical surface 28", allows obtaining a thermal break between the multi-stem cylinder 20 and the heating block 40. For example, while the heating block 40 operates at a temperature that can reach 300° C., the multi-stem cylinder 20, connected to a cooling circuit, can be kept below 100° C.

The multi-stem cylinder 20 thus cooled undergoes less wear than the heating block 40 and can be replaced much less frequently.

In a general embodiment, the method for sintering electronic components on the substrate using the press described above comprising the steps of:
  establishing a constant sintering pressure to be applied to all of the electronic components to be sintered;
  equipping the pressing group with pressing stems with respective thrust sections according to the pressing surface of the respective electronic components;
  positioning in the press a substrate with sintering glue and electronic components to be sintered so that the electronic components come into contact with the end feet of the pressing members;
  heating the pressing members to a predefined sintering temperature;
  pressurizing the compression chamber to the predefined sintering pressure;
  maintaining the sintering pressure and sintering temperature for a predetermined sintering time;
  removing the substrate from the sintering press.

In one embodiment, a protective film is adhered to the ends of the pressing members before the substrate is positioned.

In one embodiment, during the step of pressurizing the compression chamber to the predetermined sintering pressure, the sealing membrane is deformed in such a way as to come into contact both on the rear ends of the pressing stems and on a substantially flat bottom wall of the front portion of the compression chamber.

A sintering cycle will now be described in more detail.

While a sintering step is in progress, the robot 5 manages the pallets 2 which arrive in the inlet conveyor 6, picks them up and deposits them in one of the two free pre-heating stations 3.

During the sintering step, the robot 5 also manages the pallets 2 which are stationed in the three cooling stations 4. At the end of the programmed cooling cycle, the robot picks the pallet from the corresponding cooling station and deposits it in the outlet conveyor 7.

At the end of the sintering step, the following steps are carried out in succession.

The multi-stem cylinder 20 is depressurized from about 35 MPa to about 0.5 MPa. In this way, the heating pressing members 42 act as blank holders having a predefined force.

The depressurization of the multi-stem cylinder is controlled by the pressure sensors contained in the reaction block of the support unit 60.

The support unit, from the advanced pressing position, descends with a uniformly accelerated and decelerated movement completing a stroke of 200 mm.

The peripheral frame 50 drops by 10 mm, thus releasing the protective film 52.

The vacuum pump of the pressing group 14 is then gently pulse-pressurized to detach the film from the pressing members.

The unwinding reel and winding reel of the protective film are actuated, in order to position a portion of integral film under the pressing members of the pressing group. This operation must preferably be carried out with the pallet containing the newly sintered substrates still present. This prevents glue or film residues from falling on the support unit 60 or worse on the substrates yet to be sintered.

The robot picks the pallet from the press and deposits it in a free station of the three cooling stations.

The robot picks the pallet with the substrates to be sintered, which has completed the preheating cycle at 150° C., and deposits it gently in the support unit 60.

The vacuum is then activated between the pressing group 14 and the protective film, making the film adhere to the pressing members of the pressing group 14.

As soon as the robot leaves the collision area, the support unit 60 rises with a uniformly accelerated and decelerated motion. In particular, in one embodiment, in the last 15 millimeters of travel of the support unit 60 with the pallet and the relative substrates, the support unit 60 impacts with the peripheral frame 50 of the pressing group 14, thus lifting it. In the last 2 millimeters of travel of the support unit 60, the substrates centered in the pallet housings and resting directly on the respective movable reaction blocks of the support unit 60 impact with the pressing members covered by the protective film.

The pressing members 42, which in this step are slightly pressurized, retract, thus acting as blank holders.

The support unit 60 reaches the upper stroke end position.

The multi-stem cylinder is pressurized at the programmed pressure.

The pressurization of the multi-stem cylinder is controlled by the corresponding deformation sensors, which measure the cumulative compressive force applied by the pressing members on each substrate.

In one embodiment, the sintering temperature of the substrates is generated by armored cartridge resistances contained in the lower 64 and upper 40 heating blocks.

In one embodiment, the sintering temperature is controlled independently in the pressing group and in the support unit, for example with suitably positioned thermoresistances PT100.

Preferably, the substrates are heated from below through the movable reaction blocks, and from above through the pressing members and the protective film. Since the heating conditions are different, it is possible to differentiate the heating temperatures below and above in order to compensate for differences in the heat transmission to the substrates.

In one embodiment, the electronic components on the substrates are maintained for a programmed time (for example 300 seconds) at the temperature of 260° C., and pressed at 30 MPa, to carry out the sintering of the components on the substrates.

Once the sintering time has elapsed, the multi-stem cylinder is depressurized and the press re-opens as described above.

A man skilled in the art may make several changes, adjustments, adaptations and replacements of elements with other functionally equivalent ones to the embodiments of the pressing group and of the sintering press according to the invention in order to meet incidental needs, without departing from the scope of the following claims. Each of the features described as belonging to a possible embodiment can be obtained independently of the other embodiments described.

The invention claimed is:

1. A pressing group for a sintering press to carry out sintering of electronic components on a substrate, the pressing group comprising a multi-stem cylinder having a front head and a rear head together delimiting a compression chamber, wherein:
   between the front head and the rear head is interposed an annular sealing element positioned around the compression chamber,
   in the rear head an inlet passage is formed for introducing a pressurized fluid into the compression chamber in the rear head;
   in the front head pressing stems are slidingly supported, parallel and independent from each other, rear ends of said pressing stems protruding into the compression chamber,
   in the compression chamber, an actuating flat gasket extends over the rear ends of the pressing stems in such a way that, when the compression chamber is pressurized, the actuating flat gasket acts on said rear ends to transfer pressure in the compression chamber to each individual pressing stem,
   the actuating flat gasket is fixed to the front head by an anchoring frame which engages a peripheral portion of the actuating flat gasket,
   the anchoring frame is completely housed in the compression chamber so that the pressurized fluid also acts on said anchoring frame,
   wherein the compression chamber forms a bottom wall opposite the actuating flat gasket, wherein the anchoring frame has a rear surface facing and separated from said bottom wall, wherein the compression chamber is radially delimited by a side wall, and wherein the anchoring frame has a side surface facing and separated from said side wall.

2. The pressing group of claim 1, wherein the anchoring frame is screwed to the front head.

3. The pressing group of claim 1, wherein the actuating flat gasket divides the compression chamber into a front portion, the rear ends of the pressing stems protruding in said front portion, and a rear portion in fluidic communication with the inlet passage.

4. The pressing group of claim 3, wherein the front portion of the compression chamber is obtained in a lowered portion of the front head.

5. The pressing group of claim 1, further comprising a heating block integral to the multi-stem cylinder and slidingly supporting heating pressing members, each heating pressing member being operable by a respective pressing stem to act on a respective electronic component to be sintered, the heating block comprising armored resistances to heat the heating pressing members.

6. The pressing group of claim 5, wherein each pressing stem ends with a rounded end in contact with a flat end surface of a respective heating pressing member.

7. The pressing group of claim 6, wherein the heating pressing members are in the form of rods with a cross-section corresponding to, or larger than, an area of a housing of a respective electronic component to be sintered.

8. The pressing group of claim 5, wherein the heating pressing members slide with transverse play into respective axial seats made in the heating block, so as to adapt to any inclinations of the electronic components with respect to a plane defined by the substrate.

9. The pressing group of claim 1, further comprising: a peripheral frame supporting a protective film, made of polytetrafluoroethylene (PTFE), extending beyond front ends of the pressing stems or, if present, heating pressing members, and suction/blowing means facing the protective film and suitable for adhering/removing the protective film to/from said front ends.

10. A sintering press comprising
   a pressing group comprising a multi-stem cylinder having a front head and a rear head together delimiting a compression chamber, wherein:
      between the front head and the rear head is interposed an annular sealing element positioned around the compression chamber,
      in the rear head an inlet passage is formed for introducing a pressurized fluid into the compression chamber in the rear head;
      in the front head pressing stems are slidingly supported, parallel and independent from each other, rear ends of said pressing stems protruding into the compression chamber,
      in the compression chamber, an actuating flat gasket extends over the rear ends of the pressing stems in such a way that, when the compression chamber is pressurized, the actuating flat gasket acts on said rear ends to transfer pressure in the compression chamber to each individual pressing stem,
      the actuating flat gasket is fixed to the front head by an anchoring frame which engages a peripheral portion of the actuating flat gasket,
      the anchoring frame is completely housed in the compression chamber so that the pressurized fluid also acts on said anchoring frame,
      wherein the compression chamber forms a bottom wall opposite the actuating flat gasket, wherein the anchoring frame has a rear surface facing and separated from said bottom wall, wherein the compression chamber is radially delimited by a side wall, and wherein the anchoring frame has a side surface facing and separated from said side wall, and
   a support unit facing the pressing group and suitable for supporting at least one substrate, at least one of said pressing group and support unit being axially translatable with respect to the other between a retracted resting position and an advanced pressing position, in which electronic components are engageable by the pressing stems, or by heating the pressing group.

11. The sintering press of claim 10, wherein said support unit comprises a fixed reaction block, a heating block suitable for heating each substrate, and a movable reaction block.

12. The sintering press of claim 11, wherein at least one deformation cylinder with an associated deformation sensor is housed in the fixed reaction block.

* * * * *